United States Patent
Umemoto et al.

(10) Patent No.: US 7,153,800 B2
(45) Date of Patent: Dec. 26, 2006

(54) DIELECTRIC CERAMIC COMPOSITION AND MULTILAYER CERAMIC PART USING THE SAME

(75) Inventors: Takashi Umemoto, Hirakata (JP); Rintaro Aoyagi, Nagareyama (JP); Hiroshi Nonoue, Hirakata (JP); Kenichiro Wakisaka, Iga (JP)

(73) Assignee: Sanyo Electric Co., Ltd., Osaka (JP)

( * ) Notice: Subject to any disclaimer, the term of this patent is extended or adjusted under 35 U.S.C. 154(b) by 133 days.

(21) Appl. No.: 11/074,010

(22) Filed: Mar. 8, 2005

(65) Prior Publication Data
US 2005/0215418 A1    Sep. 29, 2005

(30) Foreign Application Priority Data

Mar. 8, 2004 (JP) ............. 2004-064536
Jul. 29, 2004 (JP) ............. 2004-221676

(51) Int. Cl.
*C04B 35/465* (2006.01)
*C04B 35/47* (2006.01)
(52) U.S. Cl. .................................. 501/136
(58) Field of Classification Search ........... 501/136
See application file for complete search history.

(56) References Cited

U.S. PATENT DOCUMENTS

| | | | |
|---|---|---|---|
| 3,682,766 A * | 8/1972 | Maher | 428/434 |
| 5,403,796 A * | 4/1995 | Takahashi et al. | 501/136 |
| 5,488,019 A * | 1/1996 | Abe et al. | 501/139 |
| 6,385,035 B1 * | 5/2002 | Matoba et al. | 361/321.1 |
| 6,800,577 B1 * | 10/2004 | Mailadil et al. | 501/136 |
| 6,846,767 B1 * | 1/2005 | Kim et al. | 501/136 |
| 2003/0100428 A1 | 5/2003 | Kim et al. | |
| 2005/0209090 A1 * | 9/2005 | Umemoto et al. | 501/136 |
| 2005/0288172 A1 * | 12/2005 | Umemoto et al. | 501/136 |
| 2005/0288173 A1 * | 12/2005 | Umemoto et al. | 501/136 |

FOREIGN PATENT DOCUMENTS

| | | |
|---|---|---|
| CA | 965 936 A1 | 4/1975 |
| EP | 0 534 801 A1 | 3/1993 |
| JP | 05-211007 | 8/1993 |
| JP | 06-116022 A | 4/1994 |
| JP | 2003-146742 | 5/2003 |

\* cited by examiner

*Primary Examiner*—Karl Group
(74) *Attorney, Agent, or Firm*—McDermott Will & Emery LLP

(57) ABSTRACT

A dielectric ceramic composition containing a dielectric material and a glass, characterized in that the dielectric material is represented by the compositional formula $a \cdot Li_2O - b \cdot (CaO_{1-x}-SrO_x) - c \cdot R_2O_3 - d \cdot TiO_2$ (wherein x satisfies $0 \leq x < 1$; R is at least one selected from La, Y and other rare-earth metals; and a, b, c and d satisfy $0 \leq a \leq 20$ mol %, $0 \leq b \leq 45$ mol %, $0 < c \leq 20$ mol %, $40 \leq d \leq 80$ mol % and $a+b+c+d=100$ mol %.) and the glass contains at least 30 % by weight of $Bi_2O_3$.

9 Claims, 1 Drawing Sheet

DIELECTRIC CERAMIC COMPOSITION AND MULTILAYER CERAMIC PART USING THE SAME

The priority Japanese Patent Application Numbers 2004-64536 and 2004-221676 upon which this patent application is based is hereby incorporated by reference.

BACKGROUND OF THE INVENTION

1. Field of the Invention

The present invention relates to a dielectric ceramic composition for use in multilayer ceramic parts and the like, and also to multilayer ceramic parts using the composition.

2. Description of Related Art

With the recent reduction in size and thickness of electronic parts, there is an increasing need for multilayer ceramic parts. A typical multilayer ceramic part includes, in each layer thereof, an inductor or capacitor circuit formed by using a low temperature co-fired ceramic (LTCC) which is co-firable with a conductive material such as Ag. Generally, a dielectric ceramic composition containing alumina or other ceramic filler and a glass is used as the low temperature co-fired ceramic for use in multilayer ceramic parts. However, such a composition has a low dielectric constant of 10 or below and, when applied to an LC filer, shows insufficient dielectric characteristics.

In order for a dielectric ceramic composition to be applicable to an LC filter, it must exhibit a high dielectric constant, a low dielectric loss and a temperature coefficient τf of approximately 0. As a composition which meets such characteristics, a dielectric ceramic composition having a composition of $Li_2O$—$CaO$—$Sm_2O_3$—$TiO_2$ is disclosed in Japanese Patent Laying-Open No. Hei 5-211007.

Also, Japanese Patent Laying-Open No. 2003-146742 discloses a dielectric ceramic composition containing $(Li_{0.5}(Nd, Sm)_{0.5})TiO_3$—$(Ca_{1-x}Nd_{2x/3})TiO_3$ and 3–15% by weight of a $ZnO$—$B_2O_3$—$SiO_2$ based glass frit or an $Li_2O$—$B_2O_3$—$SiO_2$ based glass frit.

However, the dielectric ceramic composition disclosed in Japanese Patent Laying-Open No. Hei 5-211007 is fired at a high temperature of about 1,300° C. and its original composition has made it difficult to be applied to multilayer ceramic parts which require firing at a low temperature of about 900° C.

The dielectric ceramic composition disclosed in Japanese Patent Laying-Open No. 2003-146742 needs to increase its glass loading in order to improve sinterability at a low temperature of about 900° C. The higher glass loading results in deterioration of dielectric characteristics, which has been a problem.

SUMMARY OF THE INVENTION

The present invention is directed toward solving the above-described problems encountered with the prior art and its object is to provide a dielectric ceramic composition which shows improved sinterability and reduced deterioration of dielectric characteristics even at a low temperature of about 900° C., as well as providing multilayer ceramic parts using the composition.

The present invention provides a dielectric ceramic composition containing a dielectric material and a glass. Characteristically, the dielectric material is represented by the compositional formula $a \cdot Li_2O$-$b \cdot (CaO_{1-x}$—$SrO_x)$-$c \cdot R_2O_3$-$d \cdot TiO_2$ (wherein x satisfies $0 \leq x < 1$; R is at least one selected from La, Y and other rare-earth metals; and a, b, c and d satisfy $0 \leq a \leq 20$ mol %, $0 \leq b \leq 45$ mol %, $0 < c \leq 20$ mol %, $40 \leq d \leq 80$ mol % and a+b+c+d=100 mol %.) and the glass contains at least 30% by weight of $Bi_2O_3$.

The $Bi_2O_3$ based glass (referring to a glass containing at least 30% by weight of $Bi_2O_3$) for use in the present invention has low softening and melting points and enters a low-viscous liquid phase in a firing step performed at about 900° C. In accordance with the present invention, this low-viscous liquid phase enables densification and thus accelerates sintering of the dielectric material. This accordingly results in improved sinterability at low temperatures.

In the present invention, the $Bi_2O_3$ content of the $Bi_2O_3$ based glass is at least 30% by weight, as described above, and more preferably at least 50% by weight. The lower $Bi_2O_3$ content may result in the failure to obtain the sufficient effect of the present invention that improves sinterability and increases a dielectric constant.

Preferably, the $Bi_2O_3$ based glass for use in the present invention further contains $B_2O_3$. Its $B_2O_3$ content is preferably 5–50% by weight, more preferably 10–40% by weight.

The dielectric material in the present invention is not particularly specified in type, so long as it is represented by the above-specified compositional formula. For example, those described in Japanese Patent Laying-Open No. Hei 5-211007 may preferably be used. Generally, the dielectric material is prepared by mixing its formulations and calcining them. Calcining may preferably be carried out at a temperature within the range of 700–1,200° C. for a time period of 1–5 hours.

The use of the dielectric material containing Nd (neodymium) for R in the above-specified compositional formula particularly improves sinterability and increases a dielectric constant of the composition.

The dielectric ceramic composition of the present invention may further contain a borosilicate based glass comprised mainly of $SiO_2$ and $B_2O_3$. Inclusion of the borosilicate based glass facilitates control of dielectric characteristics, e.g., reduces a dielectric loss.

The dielectric ceramic composition of the present invention preferably contains the $Bi_2O_3$ based glass in the amount of 1–10% by weight. If the $Bi_2O_3$ based glass content is below 1% by weight, its inclusion may result in the failure to improve sinterability of the dielectric ceramic composition when fired at about 900° C. On the other hand, if the $Bi_2O_3$ based glass content exceeds 10% by weight, its inclusion may deteriorate dielectric characteristics of the dielectric ceramic composition.

In the case where the borosilicate based glass is used, the dielectric ceramic composition preferably contains the $Bi_2O_3$ based glass and the borosilicate based glass in the total amount of 1–10% by weight. In this case, the $Bi_2O_3$ based glass content is preferably kept within the range of 1–5% by weight and the borosilicate based glass content preferably within the range of 1–5% by weight.

The dielectric ceramic composition of the present invention may further contain, as a sintering aid, at least one of $B_2O_3$ and CuO. The $B_2O_3$ content of the dielectric ceramic composition is preferably up to 15% by weight. The CuO content is preferably up to 5% by weight. If the $B_2O_3$ content of the dielectric ceramic composition exceeds 15% by weight or if the CuO content thereof exceeds 5% by weight, dielectric characteristics of the dielectric ceramic composition may deteriorate.

The multilayer ceramic part of the present invention is characterized in that it is obtained by laminating a dielectric layer formed from a slurry containing the dielectric ceramic composition of the present invention with a conductive layer.

FIG. 1 is a perspective view showing a multilayer ceramic part in accordance with the present invention and FIG. 2 is an exploded perspective view thereof. As shown in FIGS. 1 and 2, a conductive layer 2 is formed on a dielectric layer 1. The dielectric layer 1 may or may not have a via hole 3. Such dielectric layers are stacked in a pile to constitute the multilayer ceramic part.

In accordance with the present invention, a dielectric ceramic composition can be provided which shows improved sinterability even when fired at a low temperature of about 900° C. and reduced deterioration of dielectric characteristics.

DESCRIPTION OF THE PREFERRED EXAMPLES

Figure 1:
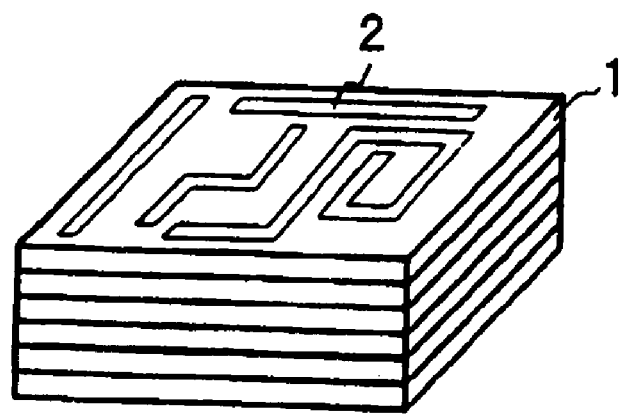
FIG. 1 is a perspective view which shows an embodiment of a multilayer ceramic part in accordance with the present invention.

The present invention is now described in detail with reference to examples. The following examples illustrate the practice of the present invention but are not intended to be limiting thereof. Suitable changes and modifications can be effected without departing from the scope of the present invention.

(EXAMPLE 1)

The following dielectric material (A) was prepared according to the below-described procedure:

(A) $Li_2O$(9 mol %)-CaO(15 mol %)-SrO(1 mol %)-$Sm_2O_3$(12 mol %)-$TiO_2$(63 mol %).

$Li_2CO_3$, $CaCO_3$, $SrCO_3$, $Sm_2O_3$ and $TiO_2$ were weighed following the above-specified compositional ratio and then mixed. After addition of isopropanol, the mixture was wet mixed for 24 hours using a ball mill consisting of a zirconia pot and a ball, and thereafter calcined at 700° C. for 2 hours to obtain the dielectric material (A).

Using the resulting dielectric material (A) and $Bi_2O_3$ based glasses, dielectric ceramic compositions were prepared. The $Bi_2O_3$ based glasses having the following compositions (G1)–(G3) were used:

(G1) $Bi_2O_3$(55% by weight)-$B_2O_3$(35% by weight)-ZnO (10% by weight), softening point: about 520° C.

(G2) $Bi_2O_3$(75% by weight)-$B_2O_3$(15% by weight)-ZnO (10% by weight), softening point: about 470 ° C.

(G3) $Bi_2O_3$(60% by weight)-$B_2O_3$(25% by weight)-ZnO (5% by weight)-$SiO_2$(10% by weight), softening point: about 540° C.

As shown in Table 1, the dielectric material (A), one of the $Bi_2O_3$ based glasses (G1)–(G3) and an optional sintering aid such as $B_2O_3$ were mixed and again pulverized using the ball mill for 20 hours.

The mixture obtained as a result of pulverization was granulated with the addition of a binder such as polyvinyl alcohol, classified and then pressed under a pressure of 2,000 kg/cm$^2$ into a product having a predetermined size and shape. This product was subjected to a debindering treatment at 500° C. for 2 hours and then fired at 900° C. for 5 hours.

Each of the obtained samples (Example Nos. 1–9) was subjected to measurement of dielectric constant and Qf value by a dielectric resonator method (Hakki-Coleman method). Its shrinkage was also measured from a dimension of the sample prior to and subsequent to firing.

(COMPARATIVE EXAMPLE 1)

The procedure of Example 1 was followed, with the exception that the below-listed borosilicate based glasses (G4)–(G8) having different softening points were used in place of the $Bi_2O_3$ based glasses, to prepare dielectric ceramic compositions:

(G4) "G3-3950" manufactured by Okuno Chem. Industries, Co., Ltd., softening point: 610° C.

(G5) "GA-4" manufactured by Nippon Electric Glass Co., Ltd., softening point: 630° C.

(G6) "GA-12" manufactured by Nippon Electric Glass Co., Ltd., softening point: 560° C.

(G7) "GA-47" manufactured by Nippon Electric Glass Co., Ltd., softening point: 870° C.

(G8) "GA-50" manufactured by Nippon Electric Glass Co., Ltd., softening point: 830° C.

The shrinkage, dielectric constant and Qf value for each of the obtained samples (Comparative Example Nos. 1–8) were measured in the same manner as in the preceding Example 1.

The measurement results for samples of Example 1 and Comparative Example 1 are shown in Table 1.

TABLE 1

| | | Glass | | Sintering Aid | | | | |
|---|---|---|---|---|---|---|---|---|
| | No. | Type | Loading (wt. %) | Type | Loading (wt. %) | Shrinkage (%) | Dielectric Constant | Qf (GHz) |
| Ex. | 1 | G1 | 5 | None | | 10.5 | 62 | 1437 |
| | 2 | G2 | 5 | None | | 12.0 | 68 | 1009 |
| | 3 | G3 | 5 | None | | 12.0 | 67 | 1115 |
| | 4 | G2 | 1 | None | | 9.8 | 55 | 3194 |
| | 5 | G2 | 2 | None | | 10.4 | 67 | 2511 |
| | 6 | G1 | 5 | $B_2O_3$ | 1 | 13.2 | 69 | 1162 |
| | 7 | G2 | 5 | $B_2O_3$ | 1 | 15.1 | 73 | 812 |
| | 8 | G3 | 5 | $B_2O_3$ | 1 | 15.8 | 76 | 929 |
| | 9 | G2 | 3 | $B_2O_3$ | 3 | 10.8 | 61 | 1293 |
| Comp. Ex. | 1 | G4 | 5 | None | | 0.8 | 30 | 2890 |
| | 2 | G4 | 10 | None | | 2.5 | 32 | 4057 |
| | 3 | G4 | 5 | $B_2O_3$ | 1 | 4.2 | 34 | 3070 |

TABLE 1-continued

|  |  | Glass | Sintering Aid |  |  |  |  |
|---|---|---|---|---|---|---|---|
| No. | Type | Loading (wt. %) | Type | Loading (wt. %) | Shrinkage (%) | Dielectric Constant | Qf (GHz) |
| 4 | G5 | 5 | $B_2O_3$ | 1 | 7.5 | 44 | 3588 |
| 5 | G6 | 5 | $B_2O_3$ | 1 | 8.3 | 47 | 3652 |
| 6 | G7 | 5 | $B_2O_3$ | 1 | 6.5 | 37 | 2420 |
| 7 | G8 | 5 | $B_2O_3$ | 1 | 3.0 |  |  |
| 8 | G6 | 5 | $B_2O_3$ | 3 | 8.9 | 46 | 3812 |

Although Example Nos. 1–9 contain the $Bi_2O_3$ based glass in the small amount of 1–5% by weight, they exhibit high shrinkage and sinterability, as shown in Table 1.

$Bi_2O_3$ based glass has a lower softening point, a lower melting point and a lower viscosity around 900° C., compared to the $Bi_2O_3$-free glass. Therefore, the improved sinterability is believed due to the $Bi_2O_3$ based glass that promotes densification of the fired product.

The dielectric ceramic composition samples (e.g., Example Nos. 6–8) containing $Bi_2O_3$ as a sintering aid exhibit improved sinterability and higher dielectric constants, compared to $Bi_2O_3$-free samples (e.g., Example Nos. 1–3). This demonstrates that the use of a sintering aid, such as $Bi_2O_3$, improves sinterability and increases a dielectric constant of the composition.

(EXAMPLE 2)

As a glass component, the $Bi_2O_3$ based glass was used in combination with the borosilicate based glass.

As a dielectric material, the electric material (A) in Example 1 was used. The $Bi_2O_3$ based glass (G2) and borosilicate based glass (G6) were used in combination, following the compositional ratio specified in Table 2, to prepare dielectric ceramic compositions.

The shrinkage, dielectric constant and Qf value for each of the obtained samples (Example Nos. 10–13) were measured in the same manner as in Example 1. The measurement results are shown in Table 2.

TABLE 2

|  |  | $Bi_2O_3$ Based Glass | | Borosilicate Based Glass | |  |  |  |
|---|---|---|---|---|---|---|---|---|
|  | No. | Type | Loading (wt. %) | Type | Loading (wt. %) | Shrinkage (%) | Dielectric Constant | Qf (GHz) |
| Ex. | 10 | G2 | 4 | G6 | 2 | 15.0 | 72 | 994 |
|  | 11 | G2 | 1 | G6 | 5 | 12.6 | 54 | 2619 |
|  | 12 | G2 | 2 | G6 | 4 | 15.5 | 66 | 985 |
|  | 13 | G2 | 1 | G6 | 3 | 9.3 | 52 | 3338 |

As can be clearly seen from the results shown in Table 2, the use of $Bi_2O_3$ based glass and borosilicate based glass in combination as a glass component improves Qf and reduces dielectric loss.

(EXAMPLE 3)

The procedure of Example 1 was followed, except that the below-specified $Li_2O$-free dielectric material (B) was used in place of the dielectric material (A), to prepare a dielectric ceramic composition:

(B) CaO(24 mol %)-SrO(1 mol %)-$Sm_2O_3$(12 mol %)-$TiO_2$(63 mol %).

The shrinkage, dielectric constant and Qf value of the obtained sample (Example No. 14) were measured in the same manner as in Example 1. The measurement results are shown in Table 3.

TABLE 3

| No. | $Bi_2O_3$ Based Glass | Loading (wt. %) | Sintering Aid | Loading (wt. %) | Shrinkage (%) | Dielectric Constant | Qf (GHz) |
|---|---|---|---|---|---|---|---|
| Ex. 14 | G2 | 5 | None |  | 12.0 | 70 | 901 |

As can be seen from Table 3, high sinterability is also obtained for Example No. 14 using the $Li_2O$-free dielectric material, as analogous to Example Nos. 1–13.

(EXAMPLE 4)

$Li_2CO_3$, $CaCO_3$, $SrCO_3$, $Nd_2O_3$ and $TiO_2$ were weighed and mixed to provide $Li_2O$—CaO—SrO—$Nd_2O_3$—$TiO_2$ having the composition (molar ratio) specified in Tables 4, 5 and 6. After addition of isopropanol, the mixture was wet mixed for 24 hours using a ball mill consisting of a zirconia pot and a ball, and thereafter calcined at 1200° C. for 2 hours to obtain a dielectric material.

Then, the $Bi_2O_3$ based glass (G2) and borosilicate based glass (G6) were added to the resulting dielectric material in the amount specified in each Table. Thereafter, they were mixed and again pulverized for 20 hours using a ball mill.

The mixture obtained as a result of pulverization was granulated with the addition of a binder such as polyvinyl alcohol, classified and then pressed under a pressure of 2,000 kg/cm$^2$ into a product having a predetermined size and shape. This product was subjected to a debindering treatment at 500° C. for 2 hours and then fired at 900° C. for 2 hours.

Each of the obtained samples (Example Nos. 15–26) was subjected to measurement of dielectric constant and Qf value by a dielectric resonator method (Hakki-Coleman method). Its shrinkage was also measured from a dimension of the sample prior to and subsequent to firing. The measurement results are given in Tables 4–6.

TABLE 4

Bi$_2$O$_3$ Based Glass (G2) 1 wt. % + Borosilicate Based Glass (G6) 1 wt. %

| | Example | | | | | |
|---|---|---|---|---|---|---|
| No. | 15 | 16 | 17 | 18 | 19 | 20 |
| Li$_2$O | 9 | 9 | 12 | 8 | 10 | 12 |
| CaO | 15 | 16 | 15 | 15 | 15 | 15 |
| SrO | 1 | 0 | 1 | 1 | 1 | 1 |
| Nd$_2$O$_3$ | 12 | 12 | 11 | 8 | 10 | 12 |
| TiO$_2$ | 63 | 63 | 63 | 48 | 56 | 64 |
| Shrinkage (%) | 11.0 | 10.2 | 11.2 | 10.4 | 10.1 | 8.9 |
| Dielectric Constant | 86.5 | 80.0 | 88.9 | 97.1 | 92.0 | 81.1 |
| Qf (GHz) | 2487 | 2690 | 2350 | 2356 | 2380 | 2279 |

TABLE 5

Bi$_2$O$_3$ Based Glass (G2) 1 wt. % + Borosilicate Based Glass (G6) 3 wt. %

| | Example | | |
|---|---|---|---|
| No. | 21 | 22 | 23 |
| Li$_2$O | 9 | 12 | 8 |
| CaO | 15 | 15 | 15 |
| SrO | 1 | 1 | 1 |
| Nd$_2$O$_3$ | 12 | 11 | 8 |
| TiO$_2$ | 63 | 63 | 48 |
| Shrinkage (%) | 12.9 | 14.5 | 13.8 |
| Dielectric Constant | 86.1 | 101.0 | 108.3 |
| Qf (GHz) | 2319 | 2198 | 2392 |

TABLE 6

Bi$_2$O$_3$ Based Glass (G2) 1 wt. % + Borosilicate Based Glass (G6) 5 wt. %

| | Example | | |
|---|---|---|---|
| No. | 24 | 25 | 26 |
| Li$_2$O | 9 | 12 | 8 |
| CaO | 15 | 15 | 15 |
| SrO | 1 | 1 | 1 |
| Nd$_2$O$_3$ | 12 | 11 | 8 |
| TiO$_2$ | 63 | 63 | 48 |
| Shrinkage (%) | 13.4 | 15.2 | 13.5 |
| Dielectric Constant | 79.1 | 95.3 | 94.3 |
| Qf (GHz) | 2361 | 2075 | 2485 |

As shown in Tables 4–6, improved sinterability and dielectric characteristics were obtained for all the samples using Nd as a rare-earth element. This is inferably because Nd, having larger ionic radius and lattice constant than Sm (samarium), increased dielectric constants of the samples. In view of the sinterability improvement, it is believed that Nd also contributed to reduction of a sintering temperature of each sample. In addition, a crystal phase of each sintered sample was evaluated by X-ray diffraction. The evaluation results revealed absence of a Sm-Ti second phase peak which was observed when Sm was used as a rare-earth element. It is believed that this enabled those samples to maintain high Qf values.

(EXAMPLE 5)

Figure 2:
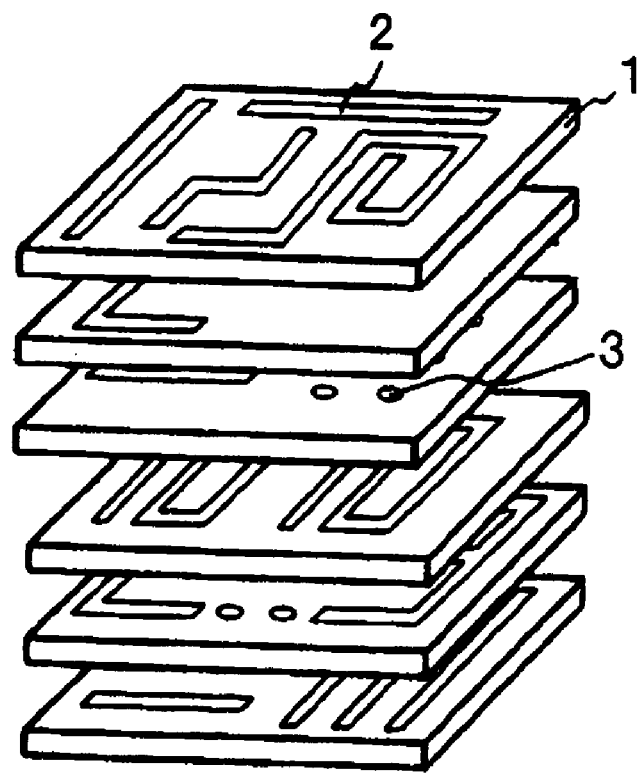
FIG. 2 is an exploded perspective view which shows an embodiment of a multilayer ceramic part in accordance with the present invention.

As described earlier, the multilayer ceramic part of the present invention can be obtained by firing multilayers of dielectric green sheets each consisting of a dielectric layer comprising the dielectric ceramic composition of the present invention and a conductive layer formed on a surface of the dielectric layer. For example, a dielectric material is obtained in the same manner as in the preceding Example. A Bi$_2$O$_3$ based glass and other additives, if necessary, are added to the dielectric material, followed by mixing in a ball mill. After addition of a polyvinyl butyral (PVB) based binder, the resultant is mixed in a ball mill to provide a slurry. The slurry is then formed into a 50–100 µm thick sheet using a doctor blade equipment. The obtained sheet is cut into a desired size. An Ag paste is printed thereon in a desired pattern to provide a dielectric green sheet. 8–20 layers of such green sheets, as shown in FIGS. 1 and 2, are stacked in a pile, bonded compressively, debindered at 400° C. and then fired at 900° C. for 2hours, resulting in a multilayer ceramic part.

What is claimed is:

1. A dielectric ceramic composition containing a dielectric material and a glass, characterized in that said dielectric material is represented by the compositional formula a·Li$_2$O-b·(CaO$_{1-x}$-SrO$_x$)-c·R$_2$O$_3$-d·TiO$_2$ (wherein x satisfies 0≦x<1; R is at least one selected from La, Y and other rare-earth metals; and a, b, c and d satisfy 0≦a≦20 mol %, 0≦b≦45 mol %, 0<c≦20 mol %, 40≦d≦80 mol % and a+b+c+d=100 mol %) and said glass contains at least 30% by weight of Bi$_2$O$_3$.

2. The dielectric ceramic composition as recited in claim 1, characterized in that said glass further contains B$_2$O$_3$.

3. The dielectric ceramic composition as recited in claim 1, characterized in that said composition contains said glass in the amount of 1–10% by weight.

4. The dielectric ceramic composition as recited in claim 1, characterized as further containing a borosilicate based glass comprised mainly of SiO$_2$ and B$_2$O$_3$.

5. The dielectric ceramic composition as recited in claim 4, characterized in that said composition contains said glass and said borosilicate based glass in the total amount of 1–10% by weight.

6. The dielectric ceramic composition as recited in claim 1, characterized as further containing, as a sintering aid, at least one of B$_2$O$_3$ up to 15% by weight and CuO up to 5% by weight.

7. A multilayer ceramic part characterized in that said multilayer ceramic part is obtained by laminating a dielectric layer formed from a slurry containing the dielectric ceramic composition as recited in claim 1 with a conductive layer.

8. The dielectric ceramic composition as recited in claim 1, characterized in that R in the compositional formula is Nd.

9. A multilayer ceramic part characterized in that said multilayer ceramic part is obtained by laminating a dielectric layer formed from a slurry containing the dielectric ceramic composition as recited in claim 8 with a conductive layer.

* * * * *